United States Patent
Doorenbos et al.

(10) Patent No.: US 8,164,364 B2
(45) Date of Patent: Apr. 24, 2012

(54) CIRCUITRY AND METHOD FOR PREVENTING BASE-EMITTER JUNCTION REVERSE BIAS IN COMPARATOR DIFFERENTIAL INPUT TRANSISTOR PAIR

(75) Inventors: Jerry L. Doorenbos, Tucson, AZ (US); Sudarshan Udayashankar, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 122 days.

(21) Appl. No.: 12/804,658

(22) Filed: Jul. 27, 2010

(65) Prior Publication Data

US 2012/0025890 A1    Feb. 2, 2012

(51) Int. Cl.
*H03K 5/22*    (2006.01)
(52) U.S. Cl. .......................................... 327/65; 327/563
(58) Field of Classification Search ............. 327/65–70, 327/560–563; 326/109; 330/252–253
See application file for complete search history.

(56) References Cited

U.S. PATENT DOCUMENTS

| 6,271,688 B1 * | 8/2001 | Marchese et al. ............. 327/65 |
| 7,339,402 B2 | 3/2008 | Alenin et al. .............. 326/109 |
| 7,554,364 B2 * | 6/2009 | Alenin et al. .............. 326/109 |

* cited by examiner

*Primary Examiner* — Quan Tra
(74) *Attorney, Agent, or Firm* — John J. Patti; Wade J. Brady, III; Frederick J. Telecky, Jr.

(57) ABSTRACT

A differential input circuit (1-1) includes first (Q0) and second (Q1) input transistors having control electrodes coupled to first ($V_{in}^+$) and second ($V_{in}^-$) input signals, respectively. A pass transistor (P3) is coupled between first electrodes of the first and second input transistors. First (N1) and second (N2) level shift transistors have control electrodes coupled to the first and second input signals, respectively. A voltage selector circuit (22) selects a voltage on a first electrode of one of the first and second level shift transistors according to which is at a higher voltage, and produces a corresponding control voltage ($V_{19}$) on a control electrode of the pass transistor so as to limit a voltage difference between the first electrode and the control electrode of the first input transistor (Q0) when it is turned off in response to a large difference between the first and second input signals.

20 Claims, 6 Drawing Sheets

CIRCUITRY AND METHOD FOR PREVENTING BASE-EMITTER JUNCTION REVERSE BIAS IN COMPARATOR DIFFERENTIAL INPUT TRANSISTOR PAIR

BACKGROUND OF THE INVENTION

The present invention relates generally to improving reliability of differentially coupled input transistors of a comparator or amplifier, and more particularly to preventing damage caused by hot carrier injection (HCI), and especially to preventing HCI due to excessive reverse bias of base-emitter junctions of differentially coupled input transistors of the comparator or amplifier or excessive gate-source voltages of differentially coupled field effect input transistors of the comparator or amplifier.

A comparator is a circuit that determines whether its input signal is higher (or lower) than a fixed or varying reference signal and accordingly switches its output to a high (or low) logic level. A comparator need not be as multi-functional as an operational amplifier, but a comparator needs to respond faster than an operational amplifier, and do so with a smaller magnitude input overdrive voltage (i.e., with a smaller difference between the input voltage to one input of the comparator and a reference voltage applied to the other input of the comparator). For a comparator, this is an advantage because phase margin and unity gain stability are not of primary concern. A basic specification for a comparator is its comparator delay $T_{DELAY}$, which is the time required for the comparator output to switch after detecting its minimum input overdrive voltage. Another specification is input overdrive voltage $V_{OVDR}$, which is the minimum differential input voltage at which the comparator responds by switching its output signal. The minimum small signal gain of a comparator can be roughly calculated as $V_{SUPPLY}/V_{OVDR}$ (input overdrive voltage). In order to achieve this gain at the necessary speed, at least two gain stages typically are required.

One of the important considerations of comparator design is the reliability of its input transistors. If a large signal differential voltage, e.g., greater than 2 volts, is applied at the inputs of a typical differential input transistor pair, the input transistor that is in its OFF or "cut-off" condition experiences a large emitter-base junction reverse bias voltage $V_{EBO}$ that exceeds 0.7 volt. This causes hot carrier generation (e.g., a tunneling or avalanche effect) in the base-emitter junction of that input transistor and may permanently degrade the current gain β and performance of the input transistor.

Prior Art FIG. 1 shows a typical differential input stage which includes differentially coupled PNP input transistors Q0 and Q1 having their emitters coupled to receive a tail current $I_{TAIL}$, and also includes associated load devices 12 and 13. This differential input stage can be used in an operational amplifier. However, a problem with using this configuration as the input stage of a comparator is that when one of the input voltages $V_{in}^+$ or $V_{in}^-$ is much more positive than the other (i.e., when a differential input voltage of large magnitude is applied to the comparator), all of the tail current $I_{TAIL}$ flows through one or the other of input transistors Q0 and Q1. If $V_{in}^-$ is much more negative than $V_{in}^+$ all of the tail current $I_{TAIL}$ will flow through transistor Q1 and the voltage on the emitter of transistor Q1 is one $V_{BE}$ voltage (base-emitter voltage) greater than $V_{in}^-$. For example, if $V_{in}^-$ is equal to +2 volts and $V_{BE}$ is equal to 0.7 volts, then the emitter of Q1 is approximately 2.7 volts. If $V_{in}^+$ is equal to +5 volts, then the reverse bias of the emitter-base junction of the OFF transistor Q0 is equal to about 2.3 volts, which is a sufficiently large reverse bias to cause hot electron injection across the emitter-base junction of transistor Q0. In this example, the hot electron injection may the degrade performance of input transistor Q0.

This is especially true for modern wafer fabrication processes in which such hot electron injection is very likely to degrade the current gain β and hence the performance of the input transistors over time. (It is believed that injected high-energy or "hot" electrons become trapped in the emitter-base junction and thereby cause the above mentioned degradation of the β of the transistor.) This can cause the matching of input transistors Q0 and Q1 to change over time due to the effects of the above mentioned large reverse bias. That would result in permanent changing over time of the input offset voltage Vos of the differential input stage. That would be highly undesirable because it would cause the switching point of a comparator to change over time.

Similarly, if MOS input transistors are used instead of PNP input transistors Q0 and Q1, a similar large gate-source reverse bias voltage on the "cut-off" MOS input transistor can result in hot electron injection that may cause a shift in the turn-on threshold voltage $V_T$ of that input transistor. Differentially coupled JFET input transistors also may undergo undesirable permanent changes due to hot electron injection.

To overcome the hot electron injection problem described above, some comparators of the prior art use a CMOS input stage which can tolerate large reverse bias between the gate and source electrodes of an input transistor. Some previous comparators include differentially coupled bipolar input transistors that can tolerate large reverse bias across their emitter-base junctions. However, as device sizes have become smaller, transistors fabricated using some recent bipolar integrated circuit manufacturing processes do not have the ability to tolerate such large reverse bias across their base-emitter junctions, and a solution to the above mentioned hot electron injection problem is needed more than ever. Up to now, the hot electron injection problem in comparator input stages has been avoided mainly by using older wafer fabrication processes to fabricate bipolar transistors that are capable of withstanding the large emitter-base reverse bias voltages.

The closest prior art is also believed to include commonly owned U.S. Pat. No. 7,339,402 entitled "Differential Amplifier with Overvoltage Protection and Method" issued Mar. 4, 2008 to Alenin et al. Prior Art FIG. 1B herein is a copy of FIG. 5 of the '402 patent, and includes circuitry 11 for preventing damage to differentially coupled PNP transistors Q3 and Q4 in integrated circuit amplifier circuitry 10C during slew-limited operation. The emitters of transistors Q3 and Q4 are coupled by JFETs (junction field effect transistors) to receive amplifier input signals $V_{in}^+$ and $V_{in}^+$, respectively. A minimum voltage selector circuit 11 includes a "separator" JFET J3 which has a source terminal connected to the base of transistor Q3, and also coupled by a diode-connected transistor Q3B to the emitter of transistor Q3. The drain terminal of separator JFET J3 is connected to the base of transistor Q4 and also is coupled by a diode-connected transistor Q4B to the emitter of transistor Q4. The gate of separator JFET J3 is controlled by other circuitry in minimum voltage selector circuit 11 so as to electrically isolate the emitters of transistors Q3 and Q4, to thereby limit the amount of reverse bias across the emitter-base junction of one of those transistors. In the circuit shown in Prior Art FIG. 1B, the input JFETs J1 and J2 are depletion mode devices. But if JFETs J1 and J2 are replaced with NPN transistors, the common mode input range of operation for the circuit of Prior Art FIG. 1B requires more than two forward-biased base-emitter voltages in order to operate.

Thus, there is an unmet need for a differential input stage of a comparator or amplifier to prevent circuit degradation due to hot carrier injection resulting from large differential input voltages.

There also is an unmet need for a differential input stage of a comparator or amplifier to prevent circuit degradation due to hot carrier injection across the emitter-base junction of a bipolar (PNP or NPN) input transistor of the differential input stage resulting from large differential input voltages applied to the differential input stage.

There also is an unmet need for a differential input stage for a comparator or amplifier which prevents circuit degradation due to hot carrier injection in a field effect input transistor of the differential input stage resulting from large differential input voltages applied to the differential input stage.

There also is an unmet need for a differential input stage for a comparator or amplifier which is able to prevent reverse bias voltages that are sufficiently large to damage the input transistors, without causing large input currents, without large internal quiescent currents, and which allows the common mode voltage or the supply voltage of the comparator or amplifier to operate beyond maximum voltage levels that can be tolerated by unprotected input transistors.

SUMMARY OF THE INVENTION

It is an object of the invention to provide a differential input stage for a comparator or amplifier to prevent circuit degradation due to hot carrier injection resulting from large differential input voltages.

It is another object of the invention to provide a differential input stage for a comparator or amplifier to prevent circuit degradation due to hot carrier injection across the emitter-base junction of a bipolar (PNP or NPN) input transistor of the differential input stage resulting from large differential input voltages applied to the differential input stage.

It is another object of the invention to provide a differential input stage for a comparator or amplifier which prevents circuit degradation due to hot carrier injection in a field effect input transistor of the differential input stage resulting from large differential input voltages applied to the differential input stage.

It is another object of the invention to provide a differential input stage for a comparator or amplifier which is able to prevent sufficiently large reverse bias voltages of input transistors from damaging them, without causing large input currents, without large internal quiescent currents, and without requiring the common mode voltage or the supply voltage of the comparator or amplifier to operate beyond maximum voltage levels that can be tolerated by an unprotected input transistors.

Briefly described, and in accordance with one embodiment, the present invention provides a differential input circuit (1-1) includes first (Q0) and second (Q1) input transistors having control electrodes coupled to first ($V_{in}^+$) and second ($V_{in}^-$) input signals, respectively. A pass transistor (P3) is coupled between first electrodes of the first and second input transistors. First (N1) and second (N2) level shift transistors have control electrodes coupled to the first and second input signals, respectively. A voltage selector circuit (22) selects a voltage on a first electrode of one of the first and second level shift transistors according to which is at a higher voltage, and produces a corresponding control voltage ($V_{19}$) on a control electrode of the pass transistor so as to limit a voltage difference between the first electrode and the control electrode of the first input transistor (Q0) when it is turned off in response to a large difference between the first and second input signals.

In one embodiment, the invention provides a differential input circuit (1-1) including first (Q0) and second (Q1) input transistors each having a first electrode, a second electrode, and a control electrode, the control electrode of the first input transistor (Q0) being coupled to a first input signal ($V_{in}^+$), and the control electrode of the second input transistor (Q1) being coupled to a second input signal ($V_{in}^-$), and circuitry (I0,I5) for biasing the first (Q0) and second (Q1) input transistors. A pass transistor (P3) is coupled between the first electrode (11A) of the first input transistor (Q0) and the first electrode (11B) of the second input transistor (Q1), for limiting a voltage difference between the first electrode and the control electrode of the first input transistor (Q0) when it is turned off in response to a large difference ($V_{in}^+-V_{in}^-$) between the first ($V_{in}^+$) and second ($V_{in}^-$) input signals, the pass transistor (P3) being a FET (field effect transistor). Clamping circuitry (14) is coupled to the first ($V_{in}^+$) and second ($V_{in}^-$) input signals and is also coupled to a control electrode of the pass transistor (P3) for controlling the pass transistor (P3). The clamping circuitry includes a first level shift transistor (N1) having a first electrode, a second electrode, and a control electrode, and a second level shift transistor (N2) having a first electrode, a second electrode, and control electrode, the first electrodes of the first (N1) and second (N2) level shift transistors being coupled to a first supply voltage ($V_{CC}$), the control electrodes of the first (N1) and second (N2) level shift transistors being coupled to the first ($V_{in}^+$) and second ($V_{in}^-$) input signals, respectively. The clamping circuitry also includes a voltage selector circuit (22 or 22A) coupled between the second electrodes of the first (N1) and second (N2) level shift transistors for selecting a voltage on the second electrode of one of the first (N1) and second (N2) level shift transistors according to which of the second electrodes of the first (N1) and second (N2) level shift transistors is at a higher voltage, and producing a corresponding control voltage on the control electrode of the pass transistor (P3).

In one embodiment, the voltage selector circuit (22 in FIG. 2A) includes first (P1) and second (P2) voltage selector transistors each having a first electrode, a second electrode, and a control electrode, the first electrodes of the first (P1) and second (P2) voltage selector transistors being coupled to the second electrodes of the first (N1) and second (N2) level shift transistors, respectively, the second electrodes of the first (P1) and second (P2) voltage selector transistors being coupled by a first conductor (19) to the control electrodes of the first (P1) and second (P2) voltage selector transistors and to the control electrode of the pass transistor (P3), the first (P1) and second (P2) voltage selector transistors being field effect transistors. In another embodiment, the voltage selector circuit (22A in FIG. 4) includes first (P1) and second (P2) voltage selector transistors each having a first electrode, a second electrode, and a control electrode, the second electrodes of the first (Px) and second (Py) level shift transistors being coupled to the control electrodes and the first electrodes of the first (P1) and second (P2) voltage selector transistors, respectively, the second electrodes of the first (P1) and second (P2) voltage selector transistors being coupled by a first conductor (19) to the control electrode of the pass transistor (P3), the first (P1) and second (P2) voltage selector transistors being field effect transistors.

A described embodiment, the biasing circuitry includes first (I0) and second (I5) current sources coupled to the first electrodes of the first (Q0) and second (Q1) input transistors, respectively, the differential input circuit also including fifth (I2) and sixth (I3) current sources coupled to bias the first (N1) and second (N2) level shift transistors, respectively. The first (Q0) and second (Q1) input transistors may be PNP transistors. The pass transistor (P3) may be a P-channel JFET (junction field effect transistor). The first (P1) and second (P2) voltage selector transistors may be P-channel JFETs. The first (N1) and second (N2) level shift transistors may be N-channel JFETs. In one embodiment, the first (PNP1 in FIG. 2C) and second (PNP2 in FIG. 2C) level shift transistors are PNP transistors. In one embodiment, the first (Q0 in FIG. 4) and second (Q1 in FIG. 4) input transistors are NPN transistors.

In one embodiment, the differential input circuit includes a first follower circuit (30 in FIG. 3) having an input coupled to the first input signal ($V_{in}^+$) and an output (23) coupled to the control electrodes of the first level shift transistor (N1) and the first input transistor (Q0) and a second follower circuit (31) having an input coupled to the second input signal ($V_{in}^-$) and an output (24) coupled to the control electrodes of the second level shift transistor (N2) and the second input transistor (Q1). In one embodiment, the first follower circuit (30) includes a first follower transistor (Q3) having a control electrode coupled to the first input signal ($V_{in}^+$) and a first electrode (23) coupled to the control electrode of the first level shift transistor (N1) and coupled by means of a first level shift resistor (R0) to the control electrode (26) of the first input transistor (Q0), and wherein the second follower circuit (31) includes a second follower transistor (Q4) having a control electrode coupled to the second input signal ($V_{in}^-$) and a first electrode (24) coupled to the control electrode of the second level shift transistor (N2) and coupled by means of a second level shift resistor (R1) to the control electrode (27) of the second input transistor (Q1). In one embodiment, first follower circuit (30) includes a first clamping diode (D0) coupled between the control electrode and the first electrode of the first follower transistor (Q1) and a second clamping diode (D1) coupled between the control electrode (26) and the first electrode (11A) of the first input transistor (Q0).

In one embodiment, a source-gate junction of the first voltage selector transistor (P1) is forward biased when the first input signal ($V_{in}^+$) is substantially greater than the second input signal ($V_{in}^-$).

In one embodiment, the invention provides a method for operating a differential input circuit (1-1) that includes first (Q0) and second (Q1) input transistors each having a first electrode, a second electrode, and a control electrode, the differential input circuit (1-1) also including circuitry (I0,I5) for biasing the first (Q0) and second (Q1) input transistors, the control electrode of the first input transistor (Q0) being coupled to a first input signal ($V_{in}^+$), and the control electrode of the second input transistor (Q1) being coupled to a second input signal ($V_{in}^-$), and a pass transistor (P3) coupled between the first electrode (11A) of the first input transistor (Q0) and the first electrode (11B) of the second input transistor (Q1) for limiting a voltage difference between the first electrode and the control electrode of the first input transistor (Q0) when it is turned off in response to a large difference ($V_{in}^+ - V_{in}^-$) between the first ($V_{in}^+$) and second ($V_{in}^-$) input signals, the pass transistor (P3) being a FET (field effect transistor), the method including operating a level shift transistor (N1) in response to the first input signal ($V_{in}^+$) to produce a first signal ($V_{20}$) on a first electrode of a first voltage selector transistor (P1) so as to forward bias a PN junction of the first voltage selector transistor (P1) and thereby produce a second signal ($V_{19}$) on a gate of the first voltage selector transistor (P1) if the magnitude of a predetermined one of the first ($V_{in}^+$) and second ($V_{in}^-$) input signals substantially exceeds the magnitude of the other; and applying the second signal ($V_{19}$) to a gate of the pass transistor (P3) so as to cause it to produce a third signal ($V_{11A}$) on both a source electrode of the pass transistor (P3) and the first electrode (11A) of the first input transistor (Q0) so that the third signal ($V_{11A}$) follows the first input signal ($V_{in}^+$) and thereby limits a voltage difference between the first electrode (11A) and the control electrode of the first input transistor (Q0) if the magnitude of the predetermined one of the first ($V_{in}^+$) and second ($V_{in}^-$) input signals substantially exceeds the magnitude of the other.

In one embodiment, the method includes biasing the first (Q0) and second (Q1) input transistors by means of first (I0) and second (I5) current sources coupled to the first electrodes of the first (Q0) and second (Q1) input transistors, respectively, and biasing the first level shift transistor (N1) by means of a third current source (I2). In one embodiment, the level shift transistor (N1) is a junction field effect transistor, and the method includes forward-biasing a gate-source junction of the level shift transistor (N1) when the first input signal ($V_{in}^+$) is substantially greater than the second input signal ($V_{in}^-$).

In one embodiment, the method includes providing a follower circuit (30) having an input coupled to the first input signal ($V_{in}^+$) and an output (23) coupled the control electrodes of the level shift transistor (N1) and the first input transistor (Q0), and wherein the follower circuit (30) includes a follower transistor (Q3) having a control electrode coupled to the first input signal ($V_{in}^+$) and a first electrode (23) coupled to the control electrode of the level shift transistor (N1), the method including shifting the level of the first signal ($V_{20}$) by means of a level shift resistor (R0) coupled between the control electrode (26) of the first input transistor (Q0) and the control electrode of the level shift transistor (N1). In one embodiment, the first (Q0) and second (Q1) input transistors are PNP transistors and the method includes limiting reverse bias voltages across an emitter-base junction of the first input transistor (Q0) to approximately 2 volts.

In one embodiment, the invention provides a differential input circuit (1-1) including first (Q0) and second (Q1) input transistors each having a first electrode, a second electrode, and a control electrode, the differential input circuit (1-1) also including circuitry (I0,I5) for biasing the first (Q0) and second (Q1) input transistors, the control electrode of the first input transistor (Q0) being coupled to a first input signal ($V_{in}^+$), and the control electrode of the second input transistor (Q1) being coupled to a second input signal ($V_{in}^-$); a pass transistor (P3) coupled between the first electrode (11A) of the first input transistor (Q0) and the first electrode (11B) of the second input transistor (Q1) for limiting the voltage difference between the first electrode and the control electrode of the first input transistor (Q0) when it is turned off in response to a large difference ($V_{in}^+ - V_{in}^-$) between the first ($V_{in}^+$) and second ($V_{in}^-$) input signals, the pass transistor (P3) being a JFET (junction field effect transistor); means (I5, I2) for operating a level shift transistor (N1) in response to the first input signal ($V_{in}^+$) to produce a first signal ($V_{20}$) on a first electrode of a first voltage selector transistor (P1) so as to forward bias a PN junction of the first voltage selector transistor (P1) and thereby produce a second signal ($V_{19}$) on a gate of the first voltage selector transistor (P1) if the magnitude of a predetermined one of the first ($V_{in}^+$) and second ($V_{in}^-$) input signals substantially exceeds the magnitude of the other; and means (14) for causing the second signal ($V_{19}$) to be applied to a gate of the pass transistor (P3) so as to produce a third signal ($V_{11A}$) on both a source of the pass transistor (P3) and the first electrode (11A) of the first input transistor (Q0) so that the third signal ($V_{11A}$) follows the first input signal ($V_{in}^+$) and limits a voltage difference between the first electrode (11A) and the control electrode of the first input transistor (Q0) if the magnitude of the predetermined one of first ($V_{in}^+$) and second ($V_{in}^-$) input signals substantially exceeds the magnitude of the other.

DETAILED DESCRIPTION OF THE PREFERRED EMBODIMENTS

The present invention solves the above mentioned problems associated with HCI (hot carrier injection) due to large differential input voltages of a comparator or amplifier input stage, by clamping the base-emitter junction of emitter-coupled input transistors so as to limit the amount of reverse bias of the emitter-base junctions and thereby prevent HCI.

As previously indicated, one of the important considerations in the design of input stages for comparators and some amplifiers is the reliability of the input transistors. If a large signal differential input voltage $V_D(max)$ of magnitude greater than approximately 2 volts is applied at the inputs of a pair of typical differentially-coupled input transistors, one of the input transistors is turned ON and the other is turned completely OFF, i.e. is "cut off". The cut off transistor undergoes a large emitter-base reverse bias voltage $V_{EBO}$ greater than approximately 0.7 volt. The large reverse breakdown voltage causes generation of hot (i.e., high energy) carriers (predominantly due to tunneling effects in some modern wafer fabrication processes) in the base-emitter junction of the cut off input transistor, and the resulting hot carrier injection may permanently degrade the performance of that input transistor.

Figure 1A:
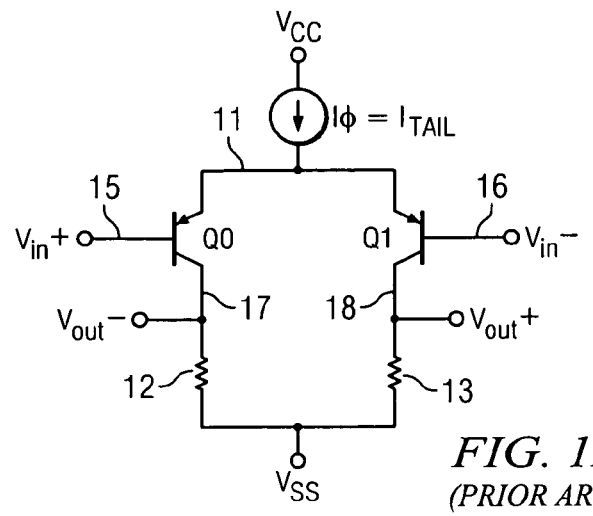
FIG. 1A is a basic schematic diagram of a typical differential input stage for a comparator or amplifier.
Figure 1B:
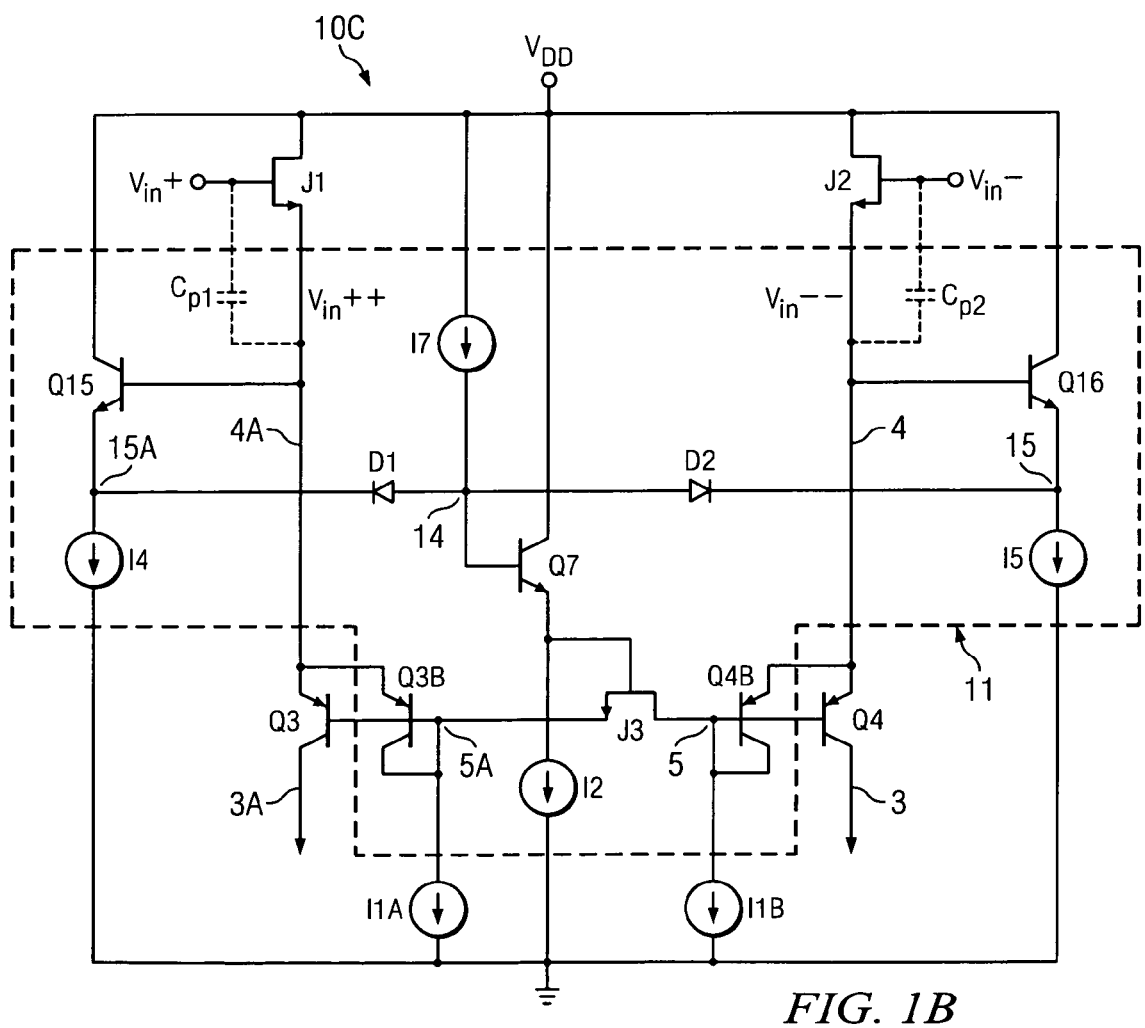
FIG. 1B is a copy of FIG. 5 of prior art U.S. Pat. No. 7,339,402.
Figure 2A:
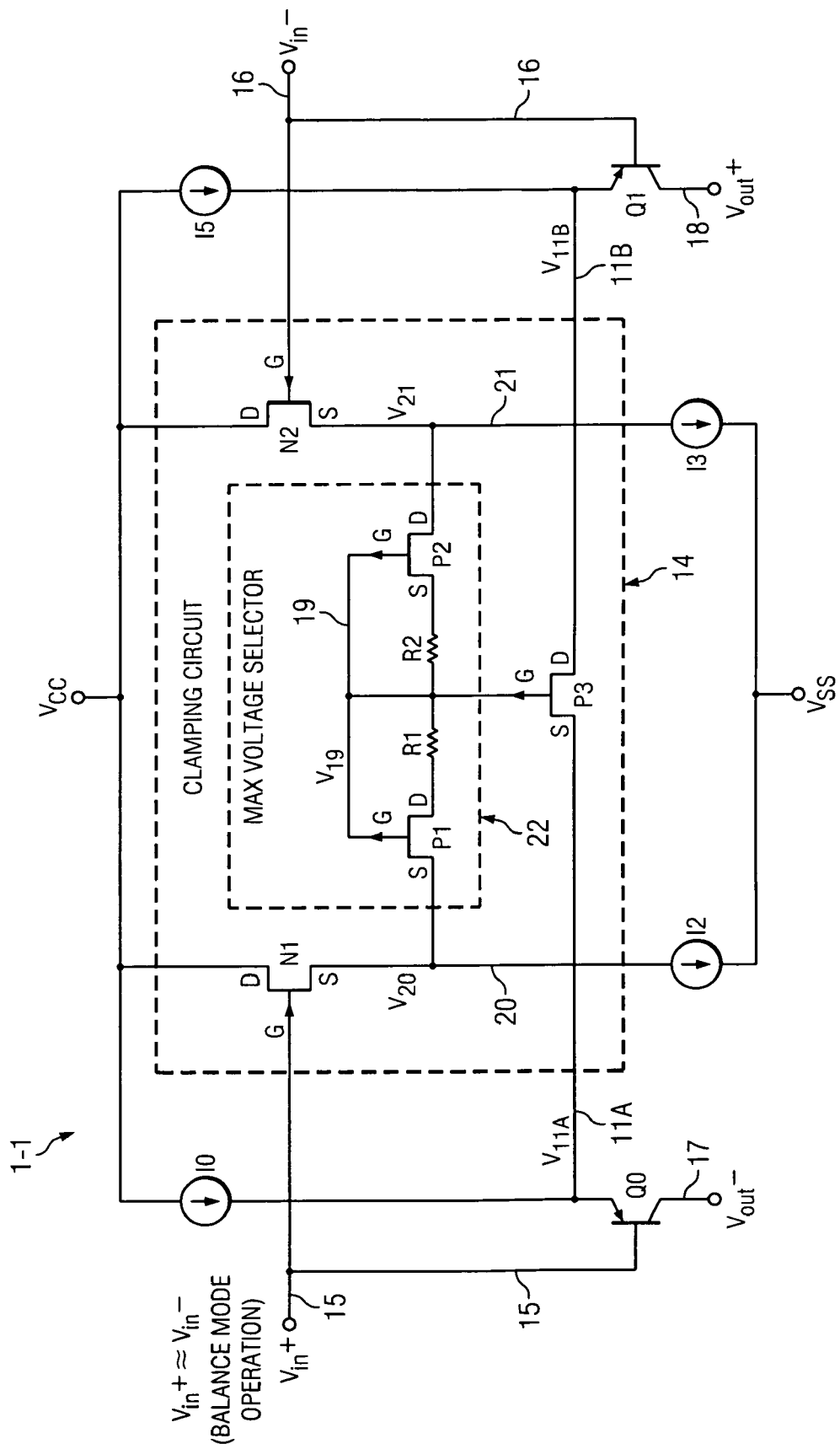
FIG. 2A is a schematic diagram of an embodiment of a PNP differential input stage of the invention indicating balanced operation for $V_{in}^+ \approx V_{in}^-$.

In FIG. 2A, input stage 1-1 includes a PNP input transistor Q0 having its base connected by conductor 15 to receive input voltage $V_{in}^+$. Conductor 15 also is connected to the gate of a N-channel junction field effect transistor (JFET) N1, referred to herein simply as "level shift transistor N1". The emitter of input transistor Q0 is connected by conductor 11A to one terminal of a current source I0 and to a first terminal of a P-channel JFET P3 referred to herein simply as "pass transistor P3". (Note that the current supplied by current source I0 is referred to as "current I0", and the currents supplied by the other current sources in the drawings are referred to in a similar manner.) The other terminal of current source I0 is connected to $V_{CC}$. The collector of input transistor Q0 is connected to conductor 17 on which an output voltage $V_{out}^-$ is generated. Conductor 17 can be connected to a suitable load device (such as resistor 12 in Prior Art FIG. 1 or a current source). The drain of level shift transistor N1 is connected to $V_{CC}$ and its source is connected by conductor 20 to a first terminal of a current source I2 and to a first terminal of a P-channel JFET P1, which is referred to herein simply as "voltage selector transistor P1". The other terminal of current source I2 is connected to $V_{SS}$.

Similarly, input stage 1-1 includes a PNP input transistor Q1 having its base connected by conductor 16 to receive input voltage $V_{in}^-$. (Note that input transistors Q0 and Q1 are analogous to input transistors Q0 and Q1 in Prior Art FIG. 1.) Conductor 16 also is connected to the gate of a N-channel level shift transistor N2. The emitter of input transistor Q1 is connected by conductor 11B to one terminal of a current source I5 and to a second terminal of P-channel pass transistor P3. The other terminal of current source I5 is connected to $V_{CC}$. The collector of input transistor Q1 is connected to conductor 18 on which an output voltage $V_{out}^+$ is generated. Conductor 18 can be connected to a suitable load device. The drain of level shift transistor N2 is connected to $V_{CC}$ and its source is connected by conductor 21 to a first terminal of a current source I3 and to a first terminal of a P-channel voltage selector transistor P2. The other terminal of current source I3 is connected to $V_{SS}$.

Input stage 1-1 also includes a maximum voltage selector circuit 22 that includes voltage selector JFETs P1 and P2, which are referred to simply as "voltage selector transistors". Voltage selector circuit 22 also includes resistors R1 and R2. The second terminal of voltage selector transistor P1 is coupled by resistor R1 to conductor 19, and the second terminal of voltage selector transistor P2 is coupled by resistor R2 to conductor 19. Conductor 19 is connected to the gates of voltage selector transistors P1 and P2 and also to the gate of pass transistor P3. (It should be understood that each current-carrying electrode of a field effect transistor may function either as a source or a drain, depending on which electrode is at a higher voltage. If at any particular time one current-carrying electrode is functioning as the source of the field effect transistor, the other electrode is functioning as the drain, or vice versa.) A clamping circuit 14 includes maximum voltage selector circuit 22 and level shift transistors N1 and N2. Pass transistor P3 also may be considered to be a part of clamping circuit 14. (In some cases it might be possible to use a depletion mode MOSFET (metal oxide semiconductor field effect transistor) as pass transistor P3. In some cases, it might also be practical to use depletion mode MOSFETs as voltage selector transistors. In some cases it might also be practical to use JFETs or depletion mode MOSFETs as resistors R1 and R2.)

The sources of N-channel level shift transistors N1 and N2 in FIG. 2A are generally at more positive voltage levels than their gates (similarly to the way the emitter of a PNP transistor is at a more positive voltage than its base). The emitters of input transistors Q0 and Q1 are coupled together through P-channel pass transistor P3 when it is in its triode region of operation. Pass transistor P3 is sufficiently large that when in its triode mode it presents a suitably small resistance between the emitters of input transistors Q0 and Q1.

Maximum voltage selector circuit 22 operates to control the gate bias voltage of pass transistor P3. In a "balanced" mode of operation $V_{in}^+$ and $V_{in}^-$ are approximately equal, and in a "unbalanced" mode of operation the maximum differential input voltage $V_D(max) = V_{in}^+ - V_{in}^-$ is greater than approximately 2 volts.

Balanced Mode Operation for $V_{in}^+ \approx V_{in}^-$

Still referring to FIG. 2A, balanced circuit operation occurs when $V_{in}^+$ and $V_{in}^-$ are equal and pass transistor P3 operates in its triode region. The current I0 flows through input transistor Q0, and current I5, which is matched to current I2, flows through input transistor Q1. The emitter-base voltages $V_{BE}$ of transistors Q0 and Q1 therefore are equal, so there is essentially no current flowing through pass transistor P3.

Specifically, $V_{in}^+$ is applied to the gate of level shift transistor N1. With the current I2 biasing level shift transistor N1, its source voltage is approximately a $V_{BE}$ voltage more positive than its gate voltage, so the voltage of conductor 20 connected between the source of level shift transistor N1 and the source of voltage selector transistor P1 is at approximately the same voltage as the emitter of input transistor Q0. (The gate-source voltage of level shift transistor N1 (or N2) depends on its scaling (i.e., its channel width to channel length ratio W/L) and the amount of current flowing in that device. An appropriate choice of device scaling is required to obtain a value of the gate-source voltage of level shift transistor N1 (or N2) of approximately one $V_{GS}$ voltage with current I2 (or I3) flowing through it. Similarly, $V_{in}^-$ is applied to the gate of level shift transistor N2. With the current I3 biasing level shift transistor N2, its source voltage is also approximately a $V_{BE}$ more positive than its gate voltage, so the voltage of conductor 21 between the source of level shift transistor N2 and the source of voltage selector transistor P2 is at the same voltage as the emitter of input transistor Q1.

Thus, during balanced-input operation essentially the same voltages are present on the sources of level shift transistors N1 and N2 and the emitters of input transistors Q0 and Q1. Voltage selector transistors P1 and P2 are in their triode regions and therefore appear as equal resistances in series with resistors R1 and R2, which also are equal. The average voltage value on conductor 19 biases the gate of pass transistor P3 it at approximately the same voltage as the voltages on its drain and source, and that causes it to operate in its triode region so it appears as a resistor connected between the emitters of input transistors Q0 and Q1. Input stage 1-1 therefore averages the source voltages of level shift transistors N1 and N2 and applies that average voltage, minus the source-gate voltage of voltage selector transistors P1 and P2, to the gate of pass transistor P3 by means of conductor 19 when input voltages $V_{in}^+$ and $V_{in}^-$ are equal, i.e., balanced.

Unbalanced Mode Operation for $V_{in}^+ - V_{in}^- > 2$ Volts

Figure 2B:
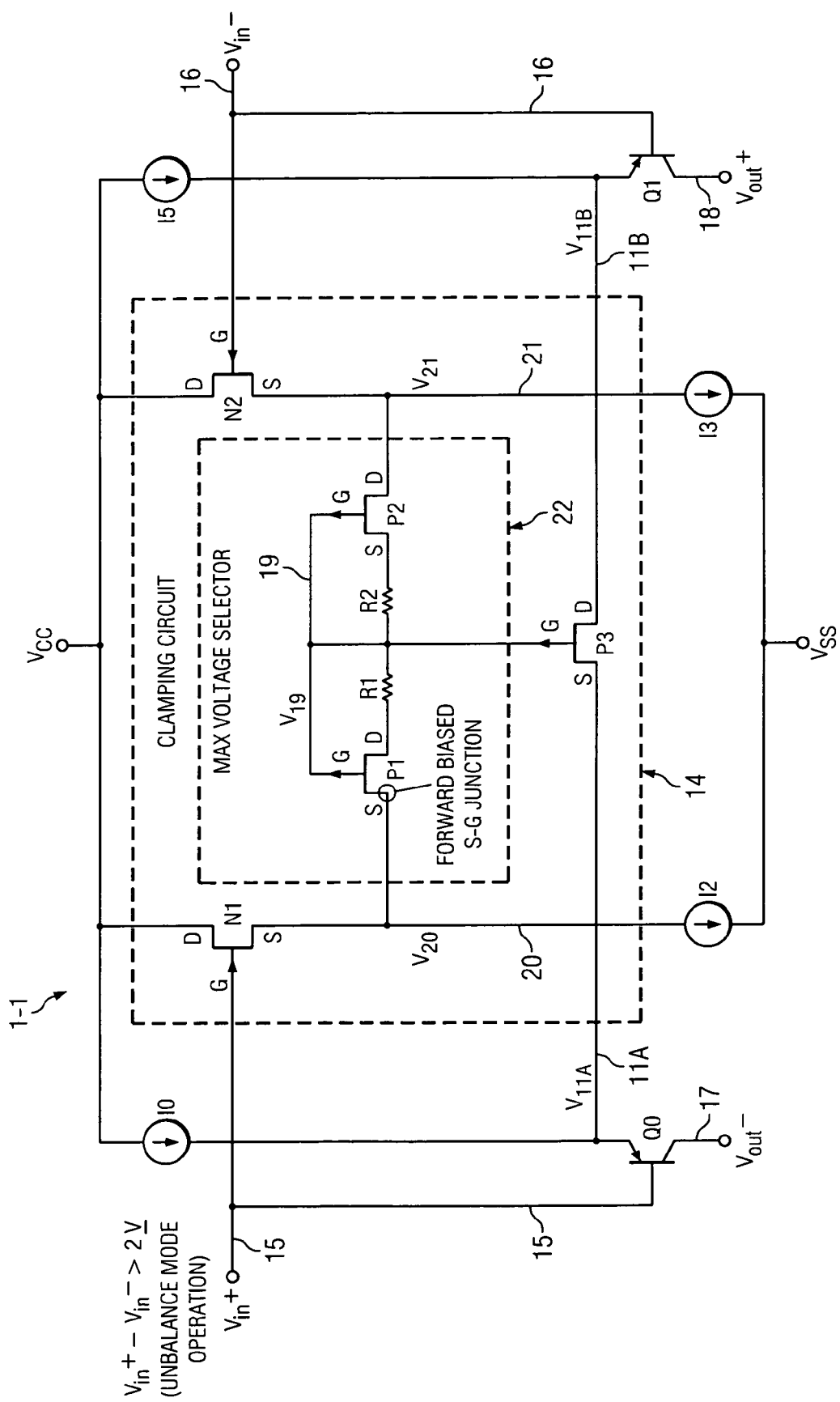
FIG. 2B is a schematic diagram of an embodiment of the PNP differential input stage of FIG. 2A indicating unbalanced operation for $V_{in}^+ - V_{in}^- \geq 2$ volts.

Referring to FIG. 2B, "unbalanced" circuit operation occurs if one of $V_{in}^+$ and $V_{in}^-$ is substantially more positive than the other. For the case in which $V_{in}^+$ is very positive relative to $V_{in}^-$, the current I0 "attempts" to flow through both input transistor Q0 and pass transistor P3. Level shift transistor N1 operates under the same bias condition as in the above described balanced mode operation with most of current I2 flowing through it, and some of current I2 also "attempts" to flow through voltage selector transistor P1. In the unbalanced mode of operation, the magnitude of the gate-source voltage of level shift transistor N1 will decrease some (or possibly, even change polarity, but not enough to forward the bias gate-source junction of level shift transistor N1), since the current flowing in level shift transistor N1 is the sum of the current I2 and the source current of maximum voltage selector transistor P1. The value of resistor R2 is chosen such that the current in the drain of maximum voltage selector transistor P2 (which is same as in the source of voltage selector transistor P1) is always less than the current I3. The easiest way to accomplish this is to set the current I3 to a level slightly larger than the current of voltage selector transistor P2 with resistor R2 in series therewith, by either using a smaller W/L ratio of transistor P2 or larger resistance for resistor R2 with reference to currents I2 and I3. All of current I2 flows through level shift transistor N1. Part of current I3 flows through level shift transistor N2 and part (probably most) of I3 flows through the maximum voltage selector circuit 22.

Since voltage selector transistor P1 is a P-channel device, the resulting voltage between its P-type drain and N-type gate may cause that PN junction to become forward biased with respect to the N-type gate of transistor P1. This results in a diode-type current flow from the source to the gate of voltage selector transistor P1. Conductor 19 is connected to the gate of voltage selector transistor P1 and also to the gate of pass transistor P3, so there is a diode-type $V_{BE}$ voltage drop of about 0.3 to 0.4 volts between the source of level shift transistor N1 and the gate of pass transistor P3. The diode-type current flowing through the forward-biased source-gate junction of voltage selector transistor P1 also flows through voltage selector transistor P2 and resistor R2. (In fact, preferred operation is to not forward bias this junction of level shift transistor N1 even for a maximum value of the current I2 plus the drain current of maximum selector transistor P2. The drain current of selector transistor P2 should always be less than the current I3 so that there is always current in level shift transistor N2.)

In any case, the resulting voltage developed across resistor R2 applies a gate-source voltage to voltage selector transistor P2. The current through resistor R2 increases until an equilibrium is reached wherein the gate-source voltage of transistor P2 suitably limits the amount of current through voltage selector transistor P1, which is operating as a forward-biased diode. The magnitude of the current through voltage selector transistor P2 should be less than either of currents I2 or I3 to ensure flow of current through level shift transistor N2 so that its source voltage is still more positive than its gate voltage. Since voltage selector transistor P1 operates as a forward-biased diode, it keeps the gate voltage of pass transistor P3 near $V_{in}^+$.

The voltage $V_{20}$ on conductor 20, which is connected to the source of level shift transistor N1, is equal to $V_{in}^+$ plus the $V_{GS}(N1)$ voltage of level shift transistor N1. The gate-source voltage of level shift transistor N1 would not forward bias that junction, and would be slightly less in magnitude than in the balanced mode of operation. That is, in the unbalanced mode of operation, the source of level shift transistor N1 might be 50-100 millivolts lower than in the balanced mode case but not enough lower to forward bias the gate-source junction. The voltage $V_{19}$ on conductor 19, i.e., on the gate of voltage selector transistor P1, is equal to $V_{20}$ minus the $V_{BE}(P1)$ voltage drop across the forward-biased source-gate junction of voltage selector transistor P1. The voltage $V_{11A}$ on conductor 11A, i.e., on the emitter of input transistor Q0, is equal to $V_{19}$ minus the gate-source voltage of pass transistor P3, which is somewhat less than its pinch-off voltage $V_P(P3)$. That causes input transistor Q0 to turn off as $V_{in}^+$ continues to increase, thereby causing all of the current I0 to flow through pass transistor P3. This operation limits the reverse bias voltage across the emitter-base junction of input transistor Q0 and prevents hot electron injection from occurring in it. The operation and effect are entirely similar for the case in which $V_{in}^-$ is substantially greater than $V_{in}^+$. Note that the foregoing analysis is subsequently set forth in more detail, with reference to FIG. 3.

Figure 2C:
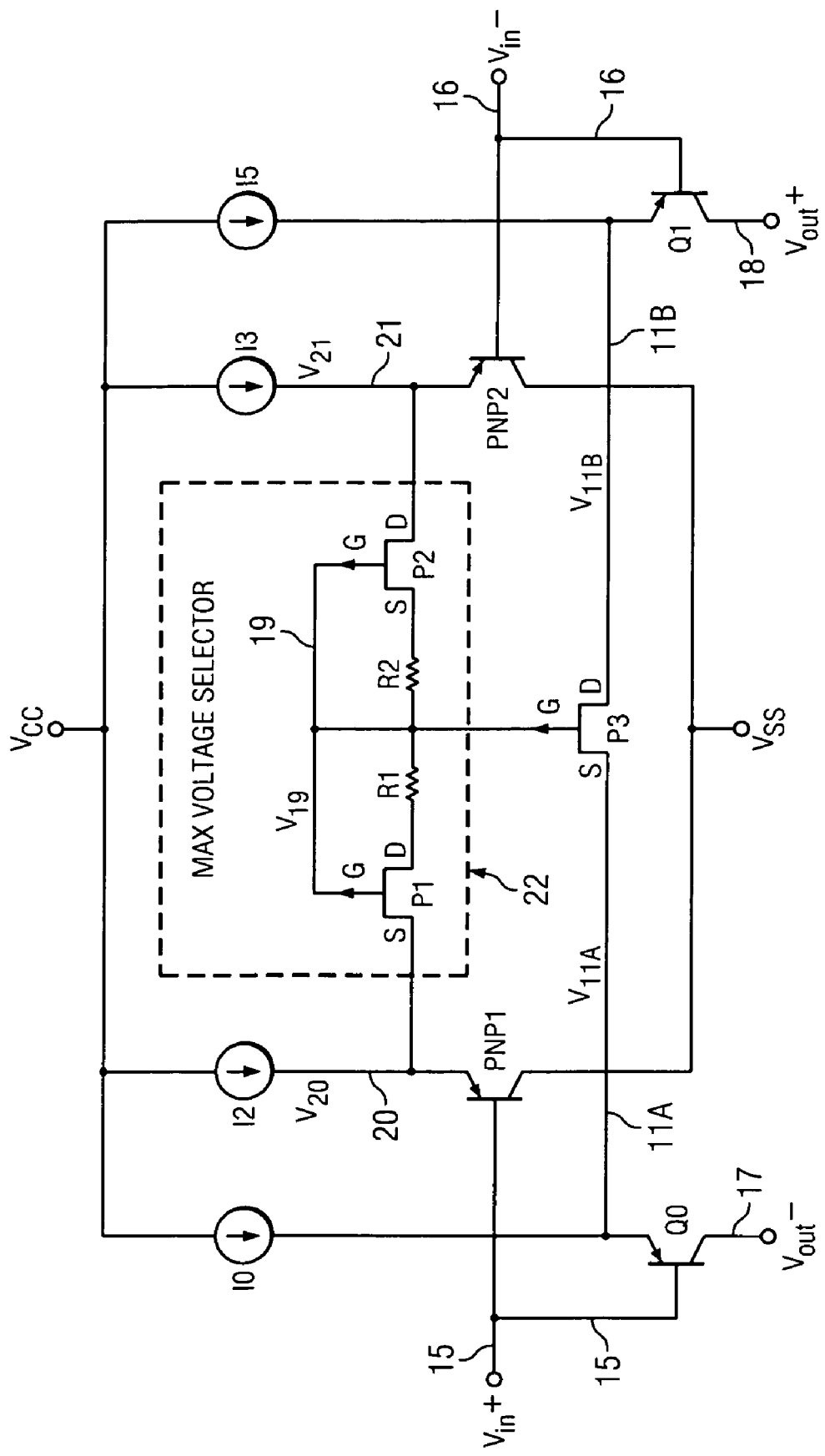
FIG. 2C is a schematic diagram of another embodiment of a PNP differential input stage of the invention.

FIG. 2C is a schematic diagram of another embodiment of a PNP differential input stage of the present invention. This differential input stage is the same as the one shown in FIG. 2A except that N-channel JFET level shift transistors N1 and N2 in FIG. 2A are replaced by PNP transistors PNP1 and PNP2, respectively, with the emitter of level shift transistor PNP1 being connected to the source of maximum voltage selector transistor P1 and to one terminal of current source I2. The other terminal of current source I2 is connected to $V_{CC}$. The base of level shift transistor PNP1 is connected to $V_{in}^+$.

Similarly, the emitter of level shift transistor PNP2 is connected to the source of maximum voltage selector transistor P2 and to one terminal of current source I3. The other terminal of current source I3 is connected to $V_{CC}$. The base of level shift transistor PNP2 is connected to $V_{in}^-$. The collectors of level shift transistors PNP1 and PNP2 are connected to $V_{SS}$. The operation of the comparator shown in FIG. 2C is entirely analogous to the operation of comparator 1-1 in FIGS. 2A and 2B.

Figure 3:
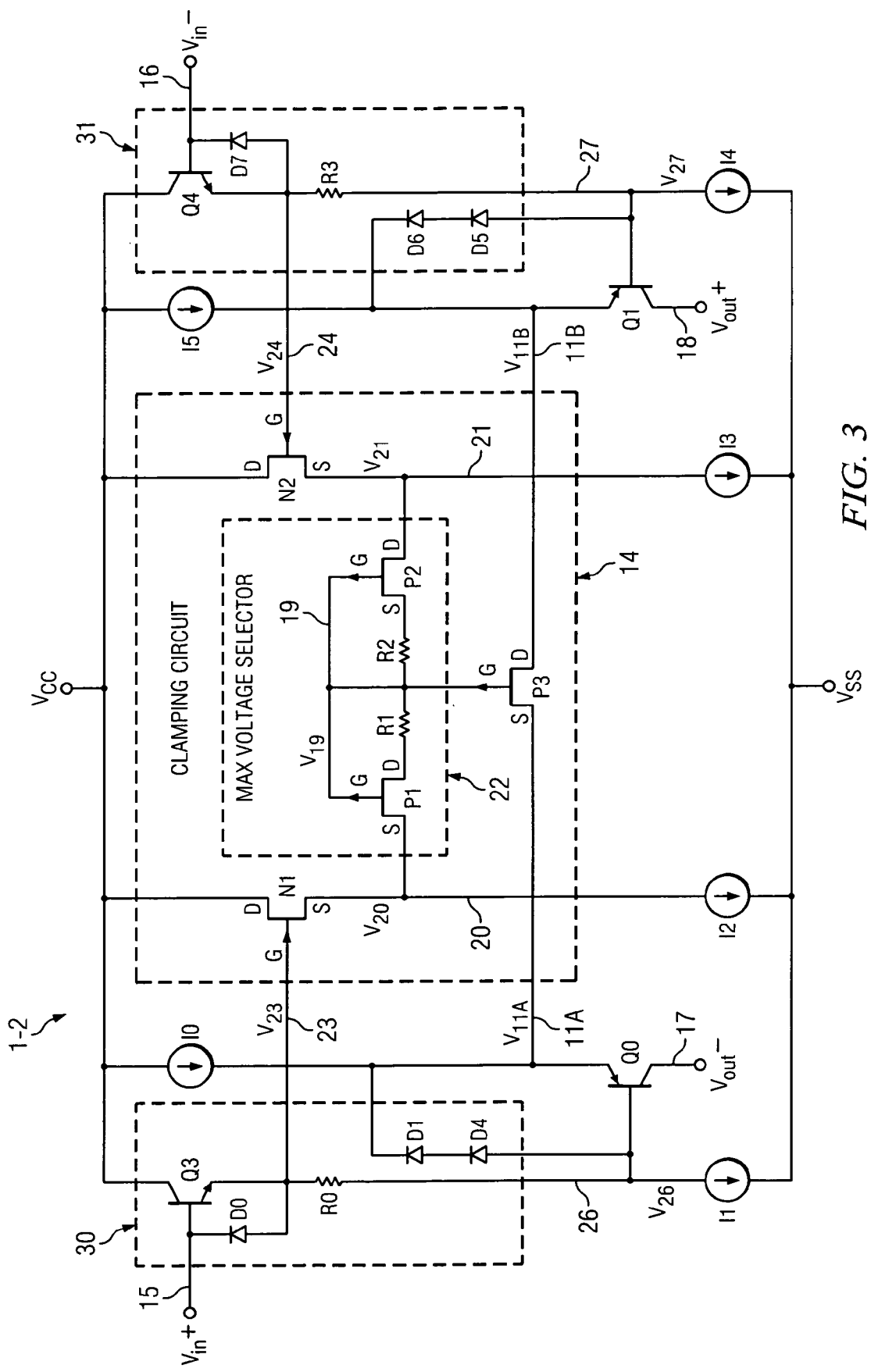
FIG. 3 is a schematic diagram of another embodiment a PNP differential input stage of the invention.

FIG. 3 shows an input stage 1-2 that includes the input stage circuitry 1-1 of FIG. 2A and further includes an input follower circuit 30 coupled to $V_{in}^+$, the gate electrode of level shift transistor N1, and the base of input transistor Q0. Input stage 1-2 also includes another input follower circuit 31 coupled to $V_{in}^-$, the gate electrode of level shift transistor N2, and the base of input transistor Q1. (The operation of the portion of the circuitry in input stage 1-2 other than input follower circuits 30 and 31 is the same as the above described operation of input stage 1-1 of FIG. 3.)

Input follower circuit 30 includes a NPN follower transistor Q3 having its base connected by conductor 15 to receive $V_{in}^+$ and also connected to the cathode of a diode D0. The collector of follower transistor Q3 is connected to $V_{CC}$ and its emitter is connected by conductor 23 to the gate of level shift transistor N1, the anode of diode D0, and one terminal of a level shift resistor R0 having its other terminal connected by conductor 26 to the base of PNP input transistor Q0, one terminal of current source I1, and to the anode of a diode D4. The cathode of diode D4 is connected to the anode of a diode D1, the cathode of which is connected to conductor 11A. Similarly, input follower circuit 31 includes a NPN follower transistor Q4 having its base connected by conductor 16 to receive $V_{in}^-$ and also connected to the cathode of a diode D7. The collector of follower transistor Q4 is connected to $V_{CC}$ and its emitter is connected by conductor 24 to the gate of level shift transistor N2, the anode of diode D7, and one terminal of a level shift resistor R3 having its other terminal connected by conductor 27 to the base of PNP input transistor Q1, one terminal of current source I4, and to the anode of a diode D5. The cathode of diode D5 is connected to the anode of a diode D6, the cathode of which is connected to conductor 11B.

Thus, differential input signal $V_{in}^+ - V_{in}^-$ is applied to an emitter follower stage 30,31 which drives a differential input transistor pair Q0,Q1. Differential clamping circuitry 14 includes level shift transistors N1 and N2, voltage selector transistors P1 and P2, level shift resistors R1 and R2, and pass transistor P3 and operates to clamp or limit reverse bias of the base-emitter junctions of input transistors Q0 and Q1. The emitter-base junctions of differential transistor pair Q0,Q1 are protected by differential clamping circuitry 14, which operates to clamp the $V_{EBO}$ voltage of the input transistor Q0 or Q1 which is cut off to approximately 1 volt or less. The clamping circuitry 14 operates properly even when the input signal $V_{in}^+$ or $V_{in}^-$ swings to a level equal to one $V_{BE}$ voltage above the upper supply rail voltage $V_{CC}$.

As previously mentioned, the lifetime of either of input transistors Q0 and Q1 may be reduced to as little as a few minutes if its $V_{EBO}$ reverse breakdown voltage is greater than 1.5 volts and thereby causes hot carrier injection to occur in the reverse-biased emitter-base junction. In PNP transistors, the emitter-base breakdown voltage $V_{EBO}$ typically is greater than 1.2 volts, and is greater than approximately 2.2 volts in NPN transistors. Input stage 1-2 may be designed to have a safe region of operation which keeps $V_{EBO}$ below 1.2 volts so that input stage 1-2 is suitable for use in input stages having both NPN and PNP transistors.

An operating point analysis of JFET clamping circuitry 14 shown in FIG. 3 is presented below. The voltage at the input of level shift transistors N1 and N2 is set by NPN emitter follower transistors Q3 and Q4 is indicated by $$V_{23} = V_G(N1) = V_{in}^+ - V_{BE}(Q3)$$

and $$V_{24} = V_G(N2) = V_{in}^- - V_{BE}(Q4),$$

where $V_{23}$ and $V_{24}$ are the voltages on conductors 23 and 24, respectively.

Since level shift transistors N1 and N2 should always be in an active ON condition, the current through maximum voltage selector transistors P1 and P2 must satisfy the expression $$I_{MVS} - I_{NB} > 0$$

where, $I_{MVS}$ is equal to the current through maximum voltage selector transistors P1 and P2 and $I_{NB}$ is equal to the tail current I2 for level shift transistor N1 and also is equal to tail current I3 for level shift transistor N2. This is to ensure that the voltage $V_{20}$ at the source of level shift transistor N1 and the voltage $V_{21}$ at the source terminal of level shift transistor N2 are given by the expressions $$V_{20} = V_S(N1) = V_{in}^+ + V_{BE}(Q3) - V_{GS}(N1)$$

and $$V_{21} = V_S(N2) = V_{in}^- - V_{BE}(Q4) - V_{GS}(N2),$$

respectively.

Therefore, assuming that $V_{in}^+$ is greater than $V_{in}^-$, maximum voltage selector circuit 22 causes the voltage at the gate of pass transistor P3 to be $$V_{19} = V_G(P3) = V_{in}^+ - V_{BE}(Q3) ABS\{V_{GS}(N1)\} - V_{SG}(P1),$$

where $V_{19}$ is the voltage on conductor 19, $V_{BE}(P1)$ is the voltage drop across the forward-biased source-drain junction of voltage selector transistor P1 and $ABS\{V_{GS}(N1)\}$ is the absolute value of $V_{GS}(N1)$.

Pass transistor P3 is sized so as to provide a suitable amount of degeneration in emitter-coupled input transistors Q0 and Q1. The final voltage at the emitter of the inactive (i.e., OFF or cut-off) bipolar transistor Q0 therefore is determined according to $$V_E(Q0) = V_{in}^+ - V_{BE}(Q3) - V_{GS}(N1) - V_{SG}(P1) - V_{GS}(P3),$$

where $V_{GS}(P3)$ is always less than the pinch-off voltage $V_P(P3)$.

A similar equation provides the final voltage at the emitter of input transistor Q1. Accordingly, $V_{EBO}$ can be calculated according to the expression $$V_{EBO}(Q0 \text{ or } Q1) = I \times R(R0 \text{ or } R3) + V_{GS}(N1 \text{ or } N2) - V_{SG}(P1 \text{ or } P2) - V_{GS}(P3).$$

(Note that the voltage of transistor Q3 or Q4 does not factor into the $V_{BE}$ of Q0 or Q1, since the top terminals of resistors R0 and R1 as shown in FIG. 3 are connected to gates of level shift transistors N1 and N2, respectively.)

Using worst case values for the parameters in the foregoing equation for a particular wafer fabrication process, the maximum value of $V_{EBO}$ is 1.2 volts. Thus, the emitter-base junctions of the input pair transistors Q0, Q1 are protected from reverse voltage breakdown and associated hot carrier injection.

In order to limit the saturation current of the P-channel JFET "diodes" P1 and P2 in maximum voltage selector circuit 22 to a low value, e.g. less than 1 microampere in one example, series level shift resistors R1 and R2 with resistances of approximately 800 kilohms are used in the diode-connected loops. (The term "diode connected loops" refers to the connection of gate of voltage selector transistor P2 to its source through resistor R2. Current in maximum voltage selector circuit 22 is limited by the fact that the voltage drop across resistor R2 results in a $V_{GS}$ voltage on maximum voltage selector transistor P2 to reduce current flow therein. Resistor R2 results in lower current than would otherwise flow if the gate and source of voltage selector transistor P2 were directly connected together. Level shift resistors R0 and R3 serve two purposes, including (1) providing additional positive level shift relative to base of Q0 or Q1 to reduce the amount of reverse bias on transistor Q0 or Q1 during unbalanced operation, and (2) allowing for voltage compliance of current sources I0 and I5 when the base of transistor Q3 and/or Q4 are higher than $V_{CC}$. (For $V_{in}{}^+ = V_{CC} + V_{BE}$, $V_E(Q)$ will be $V_{in}{}^+ - V_{BE}(Q3) - I1*R0 + V_{BE}(Q) = V_{CC} - I1*R0$, which allows a voltage of I1*R0 within which current source I0 can operate.

It has been found that the differential clamping circuitry 14 does not respond satisfactorily to fast transients in differential mode or in common mode voltages applied to the input of input stage 1-2 of FIG. 3. Transistors Q3 and Q4 do not provide clamping across Q0 and/or Q1, so for fast transients in the diodes D0, D1, D4, D5, D6, and D7 are provided.

Diodes D0 and D7 are connected as clamps across the emitter-base junctions of follower transistors Q3 and Q4 to prevent reverse biasing their emitter-base junctions during fast signal transitions of $V_{in}{}^+$ and $V_{in}{}^-$. Diodes D1, D4, D5, and D6 serve as clamps across input transistors Q0 and Q1 for the same reason. After a very fast input signal transient has settled, current source I1 continues to keep current flowing in emitter follower transistor Q3 so it remains ON. Similarly, current source I4 continues to keep current flowing in emitter follower transistor Q4 so it also remains ON. This is advantageous because without diodes D0 and D7, it is possible to substantially reverse bias the emitter-base junctions of Q3 and Q4 and thereby interrupts their operation during a very high speed input signal transient.

The currents I1 and I4 flow through resistors R0 and R1 and generate voltage shifts of a few hundred millivolts across each. The amount of this voltage shift is based on the characteristics of level shift transistors N1 and N2 as well the reverse bias of the emitter-base voltages that, in the case of a worst case process variation of the pinch-off voltage $V_P$ of pass transistor P3, would occur on input transistors Q0 and Q1 for very large magnitudes of the differential input voltage $V_{in}{}^+ - V_{in}{}^-$ if the foregoing voltage shifts are not provided. The voltage shifts across resistors R0 and R1 reduce the amount of reverse bias on the emitter-base junctions of input transistors Q0 and Q1.

A circuit similar to the one shown in FIG. 3 can be used to protect an input stage 1-3 having NPN input transistors as shown in subsequently described FIG. 4, which is essentially a mirror image of the input stage 1-2 of FIG. 3, with transistors Q0, Q1, Q3 and Q4 being of conductivity types opposite to those indicated in FIG. 3.

Figure 4:
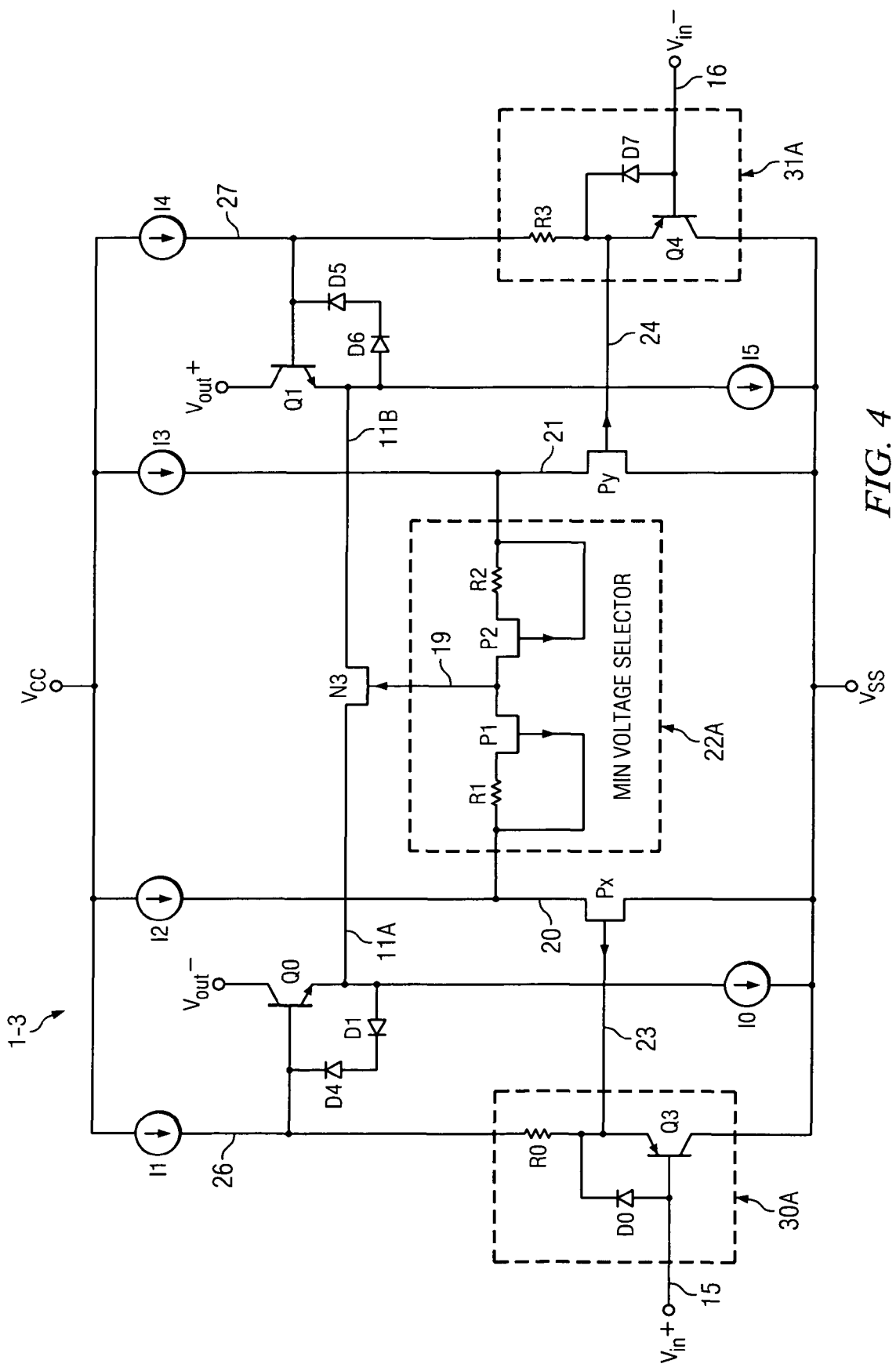
FIG. 4 is a schematic diagram of an embodiment an NPN differential input stage of the invention.

In FIG. 4, input stage 1-3 includes input follower circuit 30A coupled to $V_{in}{}^+$, the gate electrode of P-channel level shift transistor Px, and the base of NPN input transistor Q0. Input stage 1-3 also includes another input follower circuit 31A coupled to $V_{in}{}^-$, the gate electrode of P-channel level shift transistor Py, and the base of NPN input transistor Q1. A minimum voltage selector circuit 22A includes N-channel pass transistor N3, P-channel voltage selector transistors P1 and P2, and resistors R1 and R2.

One terminal of pass transistor N3 is connected by conductor 11A to the emitter of input transistor Q0 and to one terminal of current source I0, the other terminal of which is connected to $V_{SS}$. The collector of input transistor Q0 is connected to $V_{out}{}^-$. The other terminal of pass transistor N3 is connected by conductor 11B to the emitter of input transistor Q1 and to one terminal of current source I5, the other terminal of which is connected to $V_{SS}$. The collector of input transistor Q1 is connected to $V_{out}{}^+$. The gate of pass transistor N3 is connected by conductor 19 to one terminal of each of voltage selector transistors P1 and P2. The gate of voltage selector transistor P1 is connected by conductor 20 to one terminal of resistor R1, the other terminal of which is connected to the remaining terminal of voltage selector transistor P1. Similarly, the gate of voltage selector transistor P2 is connected by conductor 21 to one terminal of resistor R2, the other terminal of which is connected to the remaining terminal of voltage selector transistor P2.

Input follower circuit 30A includes a PNP follower transistor Q3 having its base connected by conductor 15 to receive $V_{in}{}^+$ and also connected to the anode of a diode D0. The collector of follower transistor Q3 is connected to $V_{SS}$ and its emitter is connected by conductor 23 to the gate of level shift transistor Px, the cathode of diode D0, and one terminal of a level shift resistor R0 having its other terminal connected by conductor 26 to the base of NPN input transistor Q0, one terminal of current source I1, and to the cathode of a diode D4. The anode of diode D4 is connected to the cathode of a diode D1, the anode of which is connected to conductor 11A. Similarly, input follower circuit 31A includes a PNP follower transistor Q4 having its base connected by conductor 16 to receive $V_{in}{}^-$ and also connected to the anode of a diode D7. The collector of follower transistor Q4 is connected to $V_{SS}$ and its emitter is connected by conductor 24 to the gate of P-channel level shift transistor Py, the cathode of diode D7, and one terminal of a level shift resistor R3 having its other terminal connected by conductor 27 to the base of NPN input transistor Q1, one terminal of current source I4, and to the cathode of a diode D5. The anode of diode D5 is connected to the cathode of a diode D6, the anode of which is connected to conductor 11B.

Thus, differential input signal $V_{in}{}^+ - V_{in}{}^-$ is applied to an emitter follower stage 30A,31A which drives a differential input transistor pair Q0,Q1. Differential clamping circuitry 14 includes level shift transistors Px and Py, voltage selector transistors P1 and P2, level shift resistors R1 and R2, and pass transistor N3 and operates to clamp or limit reverse bias of the base-emitter junctions of input transistors Q0 and Q1. The emitter-base junctions of differential transistor pair Q0,Q1 are protected by differential clamping circuitry 14, which operates to clamp the $V_{EBO}$ voltage of the input transistor Q0 or Q1 which is cut off to approximately 1 volt or less. The clamping circuitry 14 operates properly even when the input signal $V_{in}{}^+$ or $V_{in}{}^-$ swings to a level equal to one $V_{BE}$ voltage above the upper supply rail voltage $V_{CC}$.

Note that the maximum voltage selector circuit 22 shown in FIGS. 2A-C, and 3 and minimum voltage selector circuit 22A in FIGS. 4 and 4 can be implemented in various ways. For example, minimum voltage selector circuit 22A as shown in FIG. 4 may be modified so that it can be utilized in maximum voltage selector circuit 22 in FIG. 3, by replacing selector transistors P1 and P2 with N-channel JFETs. Similarly, maximum voltage selector circuit 22 as shown in FIG. 3 may be modified so that it can be utilized in minimum voltage selector circuit 22A in FIG. 4, by replacing selector transistors P1 and P2 with N-channel JFETs. Note that the resistances R1 and R2 in the minimum and maximum voltage selector circuits can be zero. This will not affect the basic operation of the circuit, but it may be necessary to increase the currents I2 and I3 in FIGS. 3 and 4 to accommodate for higher Idss currents through the voltage selector circuits.

In the case of a maximum voltage selector circuit, for example, as shown in FIG. 2A, the maximum voltage appearing on either of conductors 20 and 21 acts as the controlling voltage for the maximum voltage selector circuit. The current flowing from that maximum voltage conductor 20 or 21 to the opposite conductor (21 or 20, respectively) forward biases a PN junction in one of voltage selector transistors P1 and P2. This results in a voltage on conductor 19 which is one diode drop voltage lower than the maximum voltage on conductor 20 or 21. The voltage on conductor 19 then controls the gate of pass transistor P3. Similarly, in the case of a minimum voltage selector circuit, for example, as shown in FIG. 4, the minimum voltage appearing on either of conductors 20 and 21 acts as the controlling voltage for the minimum voltage selector circuit. The current flowing into that minimum voltage conductor 20 or 21 to the opposite conductor (21 or 20, respectively) forward biases a PN junction in one of voltage selector transistors P1 and P2. This results in a voltage on conductor 19 which is one diode drop voltage higher than the minimum voltage on conductor 20 or 21. The voltage on conductor 19 then controls the gate of pass transistor P3.

The described embodiments of the invention use simple circuitry composed of JFETs, resistors, and bipolar transistors to clamp the base-emitter junctions of the input transistors so as to prevent hot carrier injection without degrading the normal performance of the differentially coupled input transistors of an input stage. The described embodiments operate as efficiently for small input differential signals as for large input differential signals. Furthermore, the technique of the invention can be used for CMOS and JFET differential pair input transistors as well as for bipolar differential pair input transistors without substantial modification to the basic circuitry described herein.

It should be understood that the differential input circuits described herein can be readily operated as single-ended input circuits by simply connecting one of the inputs to a reference voltage and connecting the other input to receive a single-ended input signal.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although the field effect transistors in the described embodiments are JFETs, it may be practical in some cases to implement some of them as depletion mode MOSFETs.

What is claimed is:

1. A differential input circuit comprising:
    (a) first and second input transistors each having a first electrode, a second electrode, and a control electrode, the control electrode of the first input transistor being coupled to a first input signal, and the control electrode of the second input transistor being coupled to a second input signal, and circuitry for biasing the first and second input transistors;
    (b) a pass transistor coupled between the first electrode of the first input transistor and the first electrode of the second input transistor, for limiting a voltage difference between the first electrode and the control electrode of the first input transistor when it is turned off in response to a large difference between the first and second input signals, the pass transistor being a FET (field effect transistor); and
    (c) clamping circuitry coupled to the first and second input signals and also coupled to a control electrode of the pass transistor for controlling the pass transistor, the clamping circuitry including
        1) a first level shift transistor having a first electrode, a second electrode, and a control electrode, and a second level shift transistor having a first electrode, a second electrode, and control electrode, the first electrodes of the first and second level shift transistors being coupled to a first supply voltage, the control electrodes of the first and second level shift transistors being coupled to the first and second input signals, respectively, and
        2) a voltage selector circuit coupled between the second electrodes of the first and second level shift transistors for selecting a voltage on the second electrode of one of the first and second level shift transistors according to which of the second electrodes of the first and second level shift transistors is at a higher voltage, and producing a corresponding control voltage on the control electrode of the pass transistor.

2. The differential input circuit of claim 1 wherein the voltage selector circuit includes first and second voltage selector transistors each having a first electrode, a second electrode, and a control electrode, the first electrodes of the first and second voltage selector transistors being coupled to the second electrodes of the first and second level shift transistors, respectively, the second electrodes of the first and second voltage selector transistors being coupled by a first conductor to the control electrodes of the first and second voltage selector transistors and to the control electrode of the pass transistor, the first and second voltage selector transistors being field effect transistors.

3. The differential input circuit of claim 1 wherein the voltage selector circuit includes first and second voltage selector transistors each having a first electrode, a second electrode, and a control electrode, the second electrodes of the first and second level shift transistors being coupled to the control electrodes and the first electrodes of the first and second voltage selector transistors, respectively, the second electrodes of the first and second voltage selector transistors being coupled by a first conductor to the control electrode of the pass transistor, the first and second voltage selector transistors being field effect transistors.

4. The differential input circuit of claim 1 wherein the biasing circuitry includes first and second current sources coupled to the first electrodes of the first and second input transistors, respectively, the differential input circuit also including fifth and sixth current sources coupled to bias the first and second level shift transistors, respectively.

5. The differential input circuit of claim 1 wherein the first and second input transistors are PNP transistors.

6. The differential input circuit of claim 2 wherein the pass transistor is a P-channel JFET (junction field effect transistor).

7. The differential input circuit of claim 6 wherein the first and second voltage selector transistors are P-channel JFETs.

8. The differential input circuit of claim 7 wherein the first and second level shift transistors are N-channel JFETs.

9. The differential input circuit of claim 1 wherein the first and second level shift transistors are PNP transistors.

10. The differential input circuit of claim 1 wherein the first and second input transistors are NPN transistors.

11. The differential input circuit of claim 1 including a first follower circuit having an input coupled to the first input signal and an output coupled to the control electrodes of the first level shift transistor and the first input transistor and a second follower circuit having an input coupled to the second input signal and an output coupled to the control electrodes of the second level shift transistor and the second input transistor.

12. The differential input circuit of claim 11 wherein the first follower circuit includes a first follower transistor having a control electrode coupled to the first input signal and a first electrode coupled to the control electrode of the first level shift transistor and coupled by means of a first level shift resistor to the control electrode of the first input transistor, and wherein the second follower circuit includes a second follower transistor having a control electrode coupled to the second input signal and a first electrode coupled to the control electrode of the second level shift transistor and coupled by means of a second level shift resistor to the control electrode of the second input transistor.

13. The differential input circuit of claim 12 wherein the first follower circuit includes a first clamping diode coupled between the control electrode and the first electrode of the first follower transistor and a second clamping diode coupled between the control electrode and the first electrode of the first input transistor.

14. The differential input circuit of claim 2 wherein a source-gate junction of the first voltage selector transistor is forward biased when the first input signal is substantially greater than the second input signal.

15. A method for operating a differential input circuit including
  1) first and second input transistors each having a first electrode, a second electrode, and a control electrode, the differential input circuit also including circuitry for biasing the first and second input transistors, the control electrode of the first input transistor being coupled to a first input signal, and the control electrode of the second input transistor being coupled to a second input signal, and
  2) a pass transistor coupled between the first electrode of the first input transistor and the first electrode of the second input transistor for limiting a voltage difference between the first electrode and the control electrode of the first input transistor when it is turned off in response to a large difference between the first and second input signals, the pass transistor being a FET (field effect transistor),
  the method comprising:
  (a) operating a level shift transistor in response to the first input signal to produce a first signal on a first electrode of a first voltage selector transistor so as to forward bias a PN junction of the first voltage selector transistor and thereby produce a second signal on a gate of the first voltage selector transistor if the magnitude of a predetermined one of the first and second input signals substantially exceeds the magnitude of the other; and
  (b) applying the second signal to a gate of the pass transistor so as to cause it to produce a third signal on both a source electrode of the pass transistor and the first electrode of the first input transistor so that the third signal follows the first input signal and thereby limits a voltage difference between the first electrode and the control electrode of the first input transistor if the magnitude of the predetermined one of the first and second input signals substantially exceeds the magnitude of the other.

16. The method of claim 15 including biasing the first and second input transistors by means of first and second current sources coupled to the first electrodes of the first and second input transistors, respectively, and biasing the first level shift transistor by means of a third current source.

17. The method of claim 15 wherein the level shift transistor is a junction field effect transistor, and wherein the method includes forward-biasing a gate-source junction of the level shift transistor when the first input signal is substantially greater than the second input signal.

18. The method of claim 15 including providing a follower circuit having an input coupled to the first input signal and an output coupled the control electrodes of the level shift transistor and the first input transistor, and wherein the follower circuit includes a follower transistor having a control electrode coupled to the first input signal and a first electrode coupled to the control electrode of the level shift transistor, the method including shifting the level of the first signal by means of a level shift resistor coupled between the control electrode of the first input transistor and the control electrode of the level shift transistor.

19. The method of claim 15 wherein the first and second input transistors are PNP transistors, the method including limiting reverse bias voltages across an emitter-base junction of the first input transistor to approximately 2 volts.

20. A differential input circuit comprising:
  (a) first and second input transistors each having a first electrode, a second electrode, and a control electrode, the differential input circuit also including circuitry for biasing the first and second input transistors, the control electrode of the first input transistor being coupled to a first input signal, and the control electrode of the second input transistor being coupled to a second input signal;
  (b) a pass transistor coupled between the first electrode of the first input transistor and the first electrode of the second input transistor for limiting the voltage difference between the first electrode and the control electrode of the first input transistor when it is turned off in response to a large difference between the first and second input signals, the pass transistor being a JFET (junction field effect transistor);
  (c) means for operating a level shift transistor in response to the first input signal to produce a first signal on a first electrode of a first voltage selector transistor so as to forward bias a PN junction of the first voltage selector transistor and thereby produce a second signal on a gate of the first voltage selector transistor if the magnitude of a predetermined one of the first and second input signals substantially exceeds the magnitude of the other; and
  (d) means for causing the second signal to be applied to a gate of the pass transistor so as to produce a third signal on both a source of the pass transistor and the first electrode of the first input transistor so that the third signal follows the first input signal and limits a voltage difference between the first electrode and the control electrode of the first input transistor if the magnitude of the predetermined one of first and second input signals substantially exceeds the magnitude of the other.

* * * * *